United States Patent [19]

Shinichi

[11] Patent Number: 4,959,698

[45] Date of Patent: Sep. 25, 1990

[54] MEMORY CELL OF A SEMICONDUCTOR MEMORY DEVICE

[75] Inventor: Satoh Shinichi, Hyogo, Japan

[73] Assignee: Mitsubishi Denki Kabushiki Kaisha, Tokyo, Japan

[21] Appl. No.: 368,158

[22] Filed: Jun. 14, 1989

Related U.S. Application Data

[63] Continuation of Ser. No. 104,921, Oct. 6, 1987, abandoned.

[30] Foreign Application Priority Data

| Oct. 8, 1986 | [JP] | Japan | 61-240695 |
| Oct. 22, 1986 | [JP] | Japan | 61-252563 |
| Nov. 13, 1986 | [JP] | Japan | 61-270711 |
| Nov. 13, 1986 | [JP] | Japan | 61-270713 |

[51] Int. Cl.$^5$ .............. H01L 27/02; H01L 29/78; H01L 27/10

[52] U.S. Cl. ................. 357/23.6; 357/41; 357/45

[58] Field of Search .............. 357/23.6, 41, 45

[56] References Cited

U.S. PATENT DOCUMENTS 4,151,607  4/1979  Koyanagi et al. ............ 357/23.6

FOREIGN PATENT DOCUMENTS

| 135942 | 4/1985 | European Pat. Off. | ......... 357/23.6 |
| 164829 | 12/1985 | European Pat. Off. | ......... 357/23.6 |
| 198590 | 10/1986 | European Pat. Off. | ......... 357/23.6 |
| 117258 | 7/1984 | Japan | ......... 357/23.6 |

OTHER PUBLICATIONS

Nakamura, K., "Buried Isolation (BIC) Cell for Megabit MOS Dynamic RAM", IEDM 84, pp. 236–239.
Wada et al., "A Folded Capacitor Cell (FCC) for Future Megabit DRAM's", IEDM 84, pp. 244–247.

*Primary Examiner*—Rolf Hille
*Assistant Examiner*—Robert P. Limanek
*Attorney, Agent, or Firm*—Sughrue, Mion, Zinn, Macpeak & Seas

[57] ABSTRACT

A DRAM memory cell includes one transistor and one capacitor surrounded by an isolating region. A first electrode of the transistor is formed at the center of the memory cell in a major surface of a substrate. A gate electrode of the transistor is formed on the major surface of the substrate around the first electrode. The capacitor is formed around the gate electrode of the transistor, and may include, as one electrode thereof, a second electrode of the transistor. Various embodiments are described, some including formation of certain of the memory cell elements in a trench in the major surface of the substrate. As a result, current leakage is prevented, capacitor holding time is improved and transistor threshold voltage may be made more stable.

37 Claims, 4 Drawing Sheets

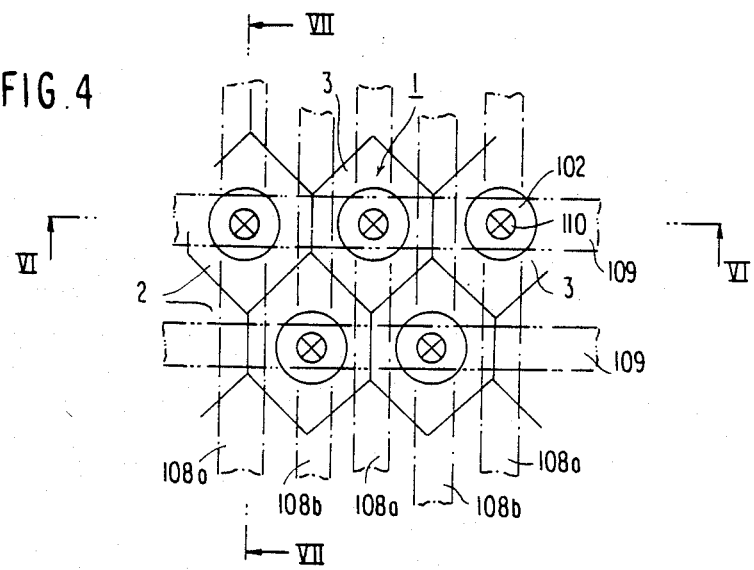
FIG. 4
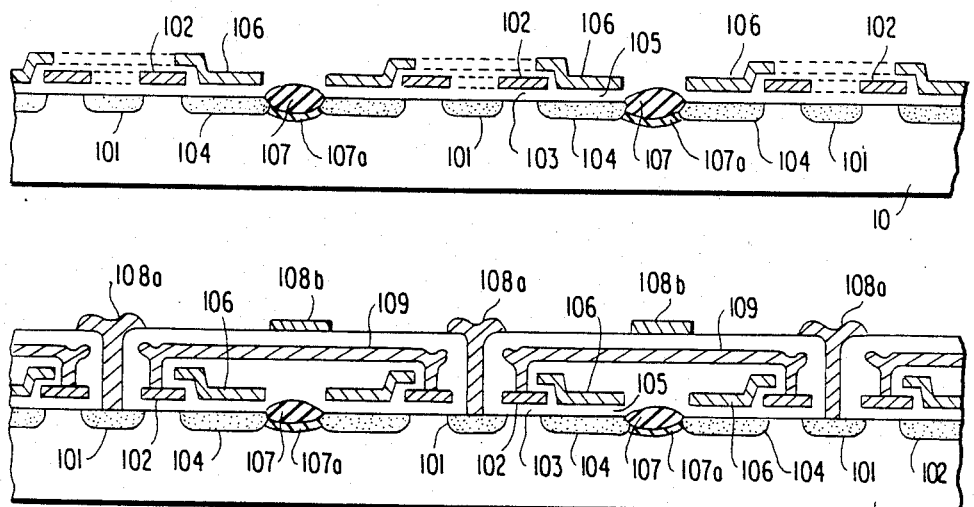
FIG. 5
FIG. 6
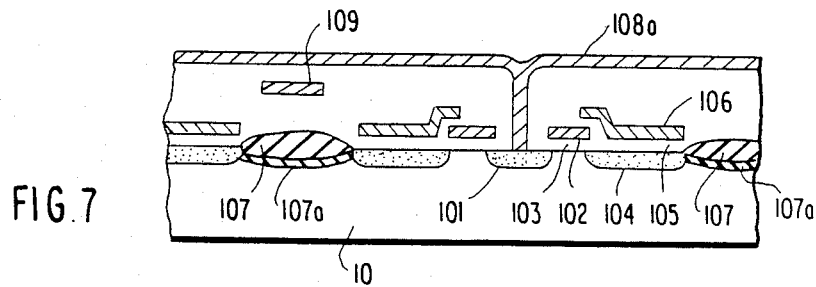
FIG. 7

MEMORY CELL OF A SEMICONDUCTOR MEMORY DEVICE

This is a continuation of application Ser. No. 104,921, filed Oct. 6, 1987.

BACKGROUND OF THE INVENTION

This invention relates to a semiconductor memory device comprised of a plurality of memory cells, each cell having one transistor and one capacitor.

FIG. 1 shows a circuit diagram of a conventional memory cell 1 of a dynamic random access memory (DRAM). including an MOS transistor 2 and a capacitor 3. The gate electrode of the transistor is connected to a word line 5, the source electrode is connected to a bit line 4, and the capacitor is connected between the drain electrode and a fixed potential node.

FIG. 2 shows a simplified horizontal or plan view of a memory cell portion of a conventional DRAM. One end of each of a pair of bit lines 4a, 4b is connected to a sense amplifier. The bit line in each column is connected to the source electrode of the transistor 2 in each column through a contact hole 7. The word lines 5 are disposed perpendicular to the bit lines 4a, 4b. Part of each word line in each column is connected to the gate electrode of a transistor 2. An isolating region 6 surrounds and isolates each memory cell 1 from adjacent cells. The isolating region 6 may be a thick insulating material formed on a major surface of a semiconductor substrate, a deep trench formed in a major surface of the substrate, or an impurity region of the same conductivity type as the substrate and having a higher impurity concentration than that of the substrate.

The capacitor 3 in each memory cell includes a cell plate, a thin insulator under the cell plate and a diffused layer in the major surface of the substrate under the cell plate. The transistor 2 in each memory cell includes, as a source electrode, a source diffused layer in the major surface of the substrate; as a drain electrode, a drain diffused layer, which is part of the diffused layer of the capacitor 3; and a gate electrode, formed on the major surface of the substrate through a gate insulator, which is part of the word line 5.

In the above-constructed memory cell, when the level of the selected word line 5 is high and the selected transistor 2 is in a conductive state during reading, the information stored in the capacitor 3 is transferred to the selected bit line 4a or 4b. When the level of the word line 5 is low and the transistor 2 is in a non-conductive state during writing the information stored in the capacitor 3 is retained.

The above described memory cell has the following problems. First of all, current leaks readily along the inside isolating face of the isolating region 6 located along the transistor 2 as shown in the direction of an arrow in FIG. 2, even when the transistor 2 is in a non-conductive state. This current leakage occurs because the direction of current flow from the bit line 4a, 4b to the capacitor is parallel to the inside isolating face of the isolating region 6. As a result, the information stored in the capacitor may be lost.

A second disadvantage arises because according to the above-described construction, a high density implanted layer for isolating adjacent memory cells from each other is diffused as far as the inside isolating face of the isolating region 6. As a result, the channel width of the transistor 2 is narrowed by the high density implanted layer, causing variability in the threshold voltage.

SUMMARY OF THE INVENTION

In view of the foregoing disadvantages, it is an object of the present invention to provide a semiconductor memory device comprising a plurality of memory cells having a reduced current leakage.

It is a further object of the invention to provide, in a semiconductor memory device, a memory cell comprising a transistor and a capacitor, wherein the threshold voltage of the transistor is not changed as a result of narrowing of the channel width thereof.

The above and other objects of the invention are achieved by providing, in a semiconductor memory device. a memory cell having one transistor and one capacitor, wherein the transistor comprises a first electrode formed as a diffused region at the center of the memory cell region and surrounded by an isolating region, and a gate electrode formed around the first electrode through a gate insulator on the major surface of the substrate. The capacitor region is formed between the gate electrode and the isolating region. A second electrode of the transistor may be formed of one of the electrodes of the capacitor.

The shape of the gate electrode prevents current leakage between the source and drain electrodes, as electron flow between the source and the drain is not parallel to the boundary of the isolating region. Another result of the structure is that change in threshold voltage of each transistor is prevented.

BRIEF DESCRIPTION OF THE DRAWINGS

Various embodiments according to the present invention will be described below with reference to the accompanying drawings. in which:

FIG. 4 is a plan view of a DRAM memory cell in accordance with the first embodiment;

FIG. 5 is a cross-sectional view taken along a line V—V in FIG. 3;

FIG. 6 is a cross-sectional view taken along a line VI—VI in FIG. 4;

FIG. 7 is a cross-sectional view taken along a line VII—VII in FIG. 4;

DETAILED DESCRIPTION OF THE PREFERRED EMBODIMENTS

Figure 1:
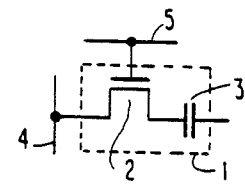
FIG. 1 is a circuit diagram of a memory cell used in a conventional DRAM.

A description of a first preferred embodiment of the present invention now will be provided with reference to FIGS. 3–7. In these Figures, each memory cell I includes one transistor 2 and one capacitor 3. A source electrode 101 of the transistor 2 is formed as an N-type diffused region by known methods at the center of the memory cell 1 in the major surface of a P-type substrate 10. A gate electrode 102 of the transistor 2 is formed of a ring metal, such as Al, or poly-Si on the major surface of the substrate 10 around the source electrode 101 through a gate insulator 103. A drain electrode 104 is formed as a second N-type diffused region by known methods in the major surface of the substrate 10, and also constitutes one electrode of the capacitor 3. The drain electrode 104 is generally annular in cross-section, having a circular inner circumference and a hexagonal outer circumference. A cell plate 106 constitutes the other electrode of the capacitor 3 and is formed of a ring metal, such as Al, or poly-Si on the major surface of the substrate 10 through a dielectric layer 105. The cell plate 106 is insulated from the gate electrode 102 by the dielectric layer 105. The cell plate 106 is similar in cross-section to that of the drain electrode 104.

Figure 3:
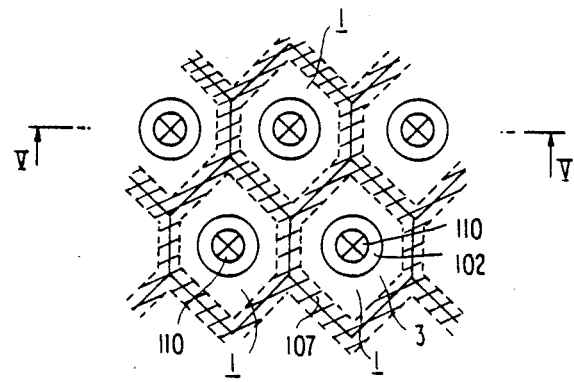
FIG. 3 is a plan view of a memory cell, excluding bit lines and word lines of a DRAM. in accordance with a first embodiment of the present invention.

An isolating region 107 is formed in the major surface of the substrate 10 around the memory cell region 1 by local oxidation of Si. The inside of the isolating region 107 contacts the outside of the drain electrode 104. The center line of the isolating region 107, indicated by a solid line in FIG. 3, is a boundary between adjacent memory cells 1. A P-type diffused region 107a is formed under the isolating region 107 for isolating adjacent memory cells 1 from each other.

A plurality of bit lines are formed of a metal such as Al, or of poly-Si, and are disposed parallel to each other. Each pair of bit lines 108a and 108b is connected to a sense amplifier (not shown). The bit line in each column is connected to the source electrode 101 of the transistor 2 in each column through a contact hole 110. A plurality of word lines 109 also are formed of a metal such as Al, or of poly-Si, and are disposed orthogonally to the bit lines 108a and 108b. The word line 109 in each row is connected to respective gate electrodes 102 of the transistors 2 in each row. The gate electrode 102, the cell plate 106 the bit lines 108a and 108b, and the word line 109 are insulated from each other by dielectric material 105.

It should be noted that while, in accordance with the just-described embodiment, the source electrode is at the center of the memory cell and the drain electrode is formed outside the gate electrode, it is within the contemplation of the present invention to switch the positions of the source and drain electrodes. depending on the type of transistor used to form the memory cell. This variation also is applicable to the embodiments which will be described below.

In a DRAM comprising a plurality of memory cells 1 as just described, the memory cells 1 are disposed in a zigzag pattern. That is, a line passing through a center of one memory cell is disposed between respective lines passing through the centers of two memory cells in an adjacent row and column. As a result, the bit line for each column is connected to the memory cells in alternating columns.

As seen in FIG. 3, the shape of each memory cell region 1 is hexagonal. The hexagonal shape is ideal, because it uses area efficiently. Also, as seen in FIG. 3, this structure has no acute angles, thereby avoiding stress in the metallization regions. Also, the contact hole 110 for a corresponding bit line is circular, and is located at the center of each memory cell.

Figure 8:
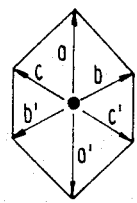
FIG. 8 shows a shape of a memory cell region in accordance with the present invention.

In FIG. 8, the distance a from the center to the first vertex is the same as the distance a' from the center to the fourth vertex. The distance b from the center to the second vertex is the same as the distance b' from the center to the fifth vertex. and the distance c from the center to the third vertex is the same as the distance c' from the center to the sixth vertex. The distance b is shorter than the distance a. As a result, one bit line and two word lines may be disposed over a memory cell. Conversely, if a is less than b, one word line and two bit lines may be disposed over a memory cell.

In a DRAM constructed of memory cells as just described in accordance with this first embodiment of the invention, when the level of the selected word line 109 is high and the selected transistor 2 is conductive during reading, the information stored in the capacitor 3 is transferred to the selected bit line 108a or 108b. When the level of the word line 109 is low and the transistor 2 is non-conductive during writing the information stored in the capacitor 3 is retained. Also, the channel region of the transistor 2, which is the current path between the source and drain electrodes 101 and 104, is not parallel to the boundary between the isolating region 107 and the memory cell 1, because the gate electrode 102 of the transistor 2 is ring-shaped.

Figure 2:
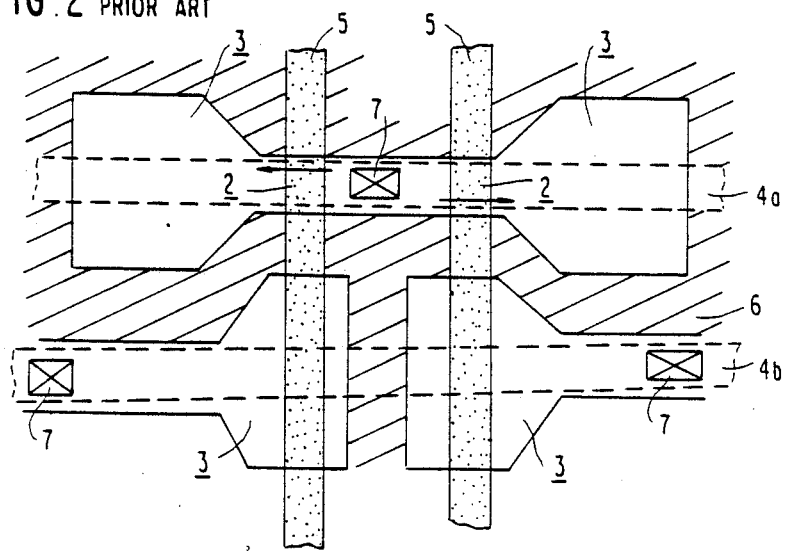
FIG. 2 is a plan view of a memory cell of a conventional DRAM.

As a result, the flow of electrons from the source electrode 101 to the drain electrode 104 is normal to, and never parallel to, the boundary of the isolation region. Thus, current leakage along the inside end of the isolating region 107 may be prevented. Further, variability in the threshold voltage in the transistor 2 in accordance with spreading of the diffused impurities from the diffused region 107a to the channel region of the transistor 2 can be prevented, unlike the device shown in FIG. 2.

Also, it should be noted, with respect to the just-described embodiment and to all of the disclosed embodiments, that since the positions of the source and drain electrodes may be reversed, depending on the type of transistor being formed, the transistors may be conductive during writing, and non-conductive during reading to enable the capacitors to function properly.

Figure 9:
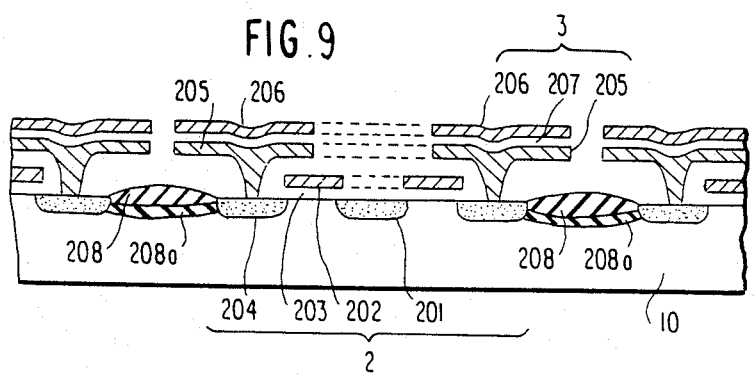
FIG. 9 shows a memory cell region in accordance with a second embodiment of the invention.

FIG. 9 shows a cross-sectional view of a memory cell in accordance with a second embodiment of the invention. In FIG. 9, a source electrode of the transistor 2 is formed as a diffused region 201 at the center of the memory cell 1 in the major surface of a substrate 10. The shape of the memory cell I is hexagonal, as in the first embodiment. Each source electrode 201 is connected to a respective bit line. A gate electrode 202 of the transistor 2 is formed of a ring metal, such as Al or of poly-Si, on the major surface of the substrate 10 around the source electrode 201 through a gate insulator 203. A drain electrode of the transistor 2 is formed as a second diffused region 204 in the major surface of the substrate 10 around the gate electrode 202. An inner surface of the drain electrode 204 is circular, and an outer surface is hexagonal.

A first cell plate 205 constitutes one electrode of the capacitor 3, and is connected to the drain electrode 204 and is formed over the major surface of the substrate 10 through a dielectric layer 207. A second cell plate 206 constitutes the other electrode of the capacitor 3 and is formed over the first cell plate 205 through the dielectric layer 207. The first and second cell plates 205 and 206 may be formed of a ring metal, such as Al, or of poly-Si, and their inner surface is circular and their outer surface is hexagonal. The first cell plate 205 is similar in cross-section to that of the second cell plate 206 and is larger in cross-section than that of the drain electrode 204. The gate electrode 202 and the first and second cell plates 205 and 206 are isolated from each other by dielectric material 207.

An isolating region 20B is formed in the major surface of the substrate 10 around the memory cell 1 by local oxidation of Si. The inside of the isolating region 208 contacts the outside of the drain electrode 204. The center line of the isolating region 208 is a boundary between the memory cell 1 and adjacent memory cells, and is hexagonal, as in the first embodiment. A diffused region 208a is formed under the isolating region 208 for isolating adjacent memory cells from each other.

A DRAM constructed of memory cells in accordance with the just-described second embodiment of the invention achieves the same current leakage prevention, threshold voltage stabilization results as does the first-described embodiment and indeed as do all of the additional embodiments to be discussed below. Further, in the second embodiment, the area of each memory cell may be smaller than that of the first embodiment, because the capacitor region overlaps the gate electrode 202 and the isolating region 208. In the first-described embodiment, the capacitor region does not overlap the gate electrode 102.

Figures 10, 11:
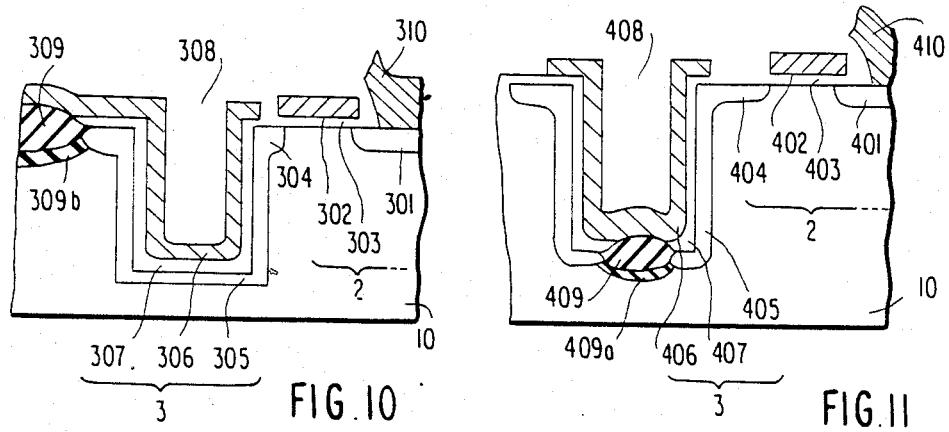
FIG. 10 is a cross-sectional view of a memory cell in accordance with a third embodiment of the invention.
FIG. 11 is a cross-sectional view of a memory cell in accordance with a fourth embodiment of the invention.

FIG. 10 shows a cross-sectional view of a memory cell in accordance with a third embodiment of the invention In FIG. 10, a source electrode 301 of the transistor 2 is a diffused region formed at the center of the memory cell 1 in the major surface of a substrate 10. The memory cell 1 is hexagonal in shape, as in the first and second embodiments. The source electrode 301 is connected to a bit line 310. A gate electrode 302 of the transistor 2 may be formed of a ring metal, such as Al, or of poly-Si on the major surface of the substrate 10 around the diffused region 301 through a gate insulator 303. A drain electrode 304 of the transistor 2 is a second diffused region formed in the major surface of the substrate 10 around the gate electrode 302. The inner surface of the drain electrode 304 is circular in shape, and the outer surface is hexagonal.

A trench 308 is formed in the major surface of the substrate 10 around the drain electrode 304. The inside and outside walls of the trench 308 are hexagonal in shape. One electrode 305 of the capacitor 3 is a third diffused region formed in the inside and outside walls and the bottom of the trench 308. One end of the third diffused region 305 is formed continuously from the end of the drain electrode 304. A cell plate 306 constitutes the other electrode of the capacitor 3, and is formed on the inside and outside walls and bottom of the trench 308 through a dielectric layer 307. The cell plate 306 is formed of metal or of poly-Si and is connected to the adjoining cell plate of the adjoining memory cell.

An isolating region 309 is formed in the major surface of the substrate 10 around the memory cell by local oxidation of Si. The inside of the isolating region 309 contacts the outside of the third diffused region 305. The center line of the isolating region 309 forms a boundary between the memory cell 1 and the adjoining memory cells, and the center line around each memory cell 1 is hexagonal in shape as in the previous embodiments. A diffused region 309b is formed under the isolating region 309 to isolate adjacent memory cells from each other.

A DRAM constructed of memory cells in accordance with the third embodiment of the present invention achieves results similar to those of previously-described embodiments. Further, according to the just-described third embodiment, the area of each memory cell may be smaller than that of the first embodiment, because the inside wall, outside wall, and bottom of the trench 308 constitute the capacitor region.

FIG. 11 shows a cross-sectional view of a memory cell in accordance with a fourth embodiment of the invention. In FIG. 11, a source electrode 401 of the transistor 2 is a diffused region formed at the center of the memory cell 1 in a major surface of a substrate 10. The outer surface of the memory cell is hexagonal, as in previous embodiments. The source electrode 401 is connected to the bit line 410.

A gate electrode 402 of the transistor 2 is formed of a ring metal, such as Al, or poly-Si on the major surface of the substrate 10 around the source electrode 401 through a gate insulator 403. A drain electrode 404 of the transistor 2 is formed as a second diffused region in the major surface of the substrate 10 around the gate electrode 402. The inner surface of the drain electrode 404 is circular and the outer surface thereof is hexagonal.

A hexagonal trench 408 is formed in the major surface of the substrate 10 around the memory cell 1. An inside wall of the trench 408 is hexagonal in shape. An isolating region 409 is formed in the bottom of the trench 408 around the memory cell by local oxidation of Si. The cross-sectional area of the isolating region 409 around one of the memory cells is hexagonal in shape. The center line of the isolating region 409 is a boundary between adjoining memory cells.

A third diffused region 405, constituting one electrode of the capacitor 3, is formed in the wall of the trench 408 nearer the drain electrode 404. One end of the third diffused region 405 is formed continuously from the end of the drain electrode 404 and the other end thereof contacts the end of the isolating region 409.

A cell plate 406 is formed over both walls and the bottom of the trench 408 through a dielectric layer 407 by metal or polySi. The part of the cell plate 406 facing the third diffused region 405 constitutes the other electrode of the capacitor 2. The remaining part of the cell plate 406 is the other electrode of the capacitors of the adjoining memory cells. A diffused region 409b is formed under the isolating region 409 for isolating adjacent memory cells from each other.

A DRAM constructed of memory cells in accordance with the fourth embodiment of the present invention achieves results similar to those of previously-described embodiments. Further memory cell area may be smaller in the fourth embodiment than in the first embodiment, because the side walls of the trench 408 are used as the capacitor region. The conductor connecting the other electrodes is not needed, as the cell plate 406 is connected at the bottom of the trench 408.

Figure 12:
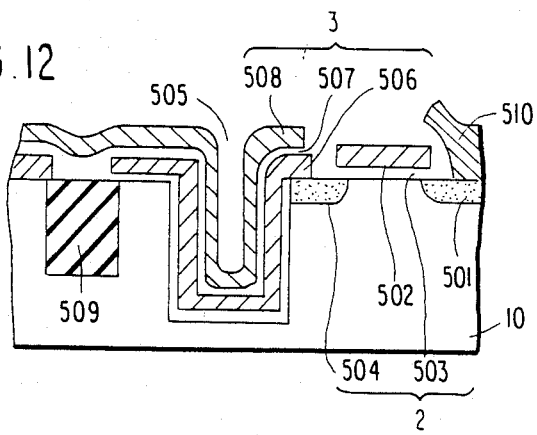
FIG. 12 is a cross-sectional view of a memory cell in accordance with a fifth embodiment of the invention.

FIG. 12 shows a cross-sectional view of a memory cell in accordance with a fifth embodiment of the invention. In FIG. 12, a source electrode 501 of the transistor 2 is formed as a diffused region at the center of the memory cell in the major surface of a substrate 10. The shape of the memory cell is hexagonal, as in previous embodiments. The source electrode 501 is connected to the bit line 510. A gate electrode 502 of the transistor 2 is formed of a ring metal, such as Al, or poly-Si on the major surface of the substrate 10 around the source electrode 501 through a gate insulator 503.

A drain electrode 504 of the transistor 2 is formed as a second diffused region in the major surface of the substrate 10 around the gate electrode 502. The inner surface of the drain electrode 504 is circular and the outer surface is hexagonal.

A hexagonal trench 505 is formed in the major surface of the substrate 10 around the drain electrode 504. A first cell plate 506 constitutes one electrode of the capacitor 3 and is formed over both side walls and the bottom of the trench 505 through a dielectric layer 507. An inside portion of the cell plate 506 is connected to the drain electrode 504. A second cell plate 508 constitutes the other electrode of the capacitor 3 and is formed over the first cell plate 506 through the dielectric layer 507. The outside portion of the second cell plate 508 is connected to an outside portion of the second cell plate 508 in an adjacent memory cell.

The first and second cell plates may be formed of metal or poly-Si. The planar shape of the second cell plate 508 in the capacitor is similar to the planar shape of the first cell plate 506. The gate electrode 503 and the first and second cell plates 506, 508 all are isolated from each other by a dielectric layer 507.

An isolating region 509 is formed in the major surface of the substrate 10 around the memory cell by local oxidation of Si. The center line of the isolating region 509 is a boundary between adjacent memory cells, and the center line around each memory cell 1 is hexagonal, as in previous embodiments.

A DRAM constructed of memory cells in accordance with the fifth embodiment of the invention achieves similar results to those of previously-described embodiments. Further, the memory cell area according to the fifth embodiment may be smaller than that of the first embodiment, because both side walls and the bottom of the trench 505 are used as the capacitor region.

Figure 13:
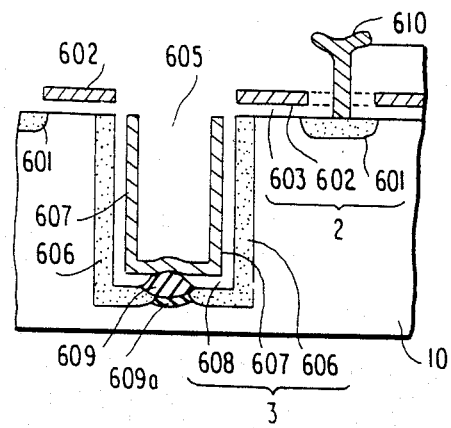
FIG. 13 is a cross-sectional view of a memory cell in accordance with a sixth embodiment of the invention.

FIG. 13 shows a cross-sectional view of a memory cell in accordance with a sixth embodiment of the invention. In FIG. 13, a source electrode 601 of the transistor 2 is formed as a diffused region at the center of the memory cell 1 in the major surface of a substrate 10. The shape of the memory cell 1 is hexagonal as in previous embodiments. The source electrode 601 is connected to a bit line 610. A gate electrode 602 of the transistor 2 is formed of a ring metal, such as Al, or poly-Si on the major surface of the substrate 10 around the source electrode 601 through a gate insulator 603.

A trench 605 is formed in the major surface of the substrate 10 around the memory cell 1. The inside wall of the trench 605 has a hexagonal shape. An isolating region 609 is formed in the bottom of the trench 605 around the memory cell 1 by local oxidation of Si. The planar shape of the isolating region 609 is a boundary between the memory cell and the adjoining memory cell as in the first embodiment.

A second diffused region 606 constituting both a drain electrode of the transistor 2 and one electrode of the capacitor 3, is formed in one of the walls of the trench 605 near the gate electrode 601 and half of the bottom of the trench 605. One end of the second diffused region 606 is located directly under the end of the gate electrode 602. The other end of the second diffused region 606 contacts the end of the isolating region 609.

A cell plate 607 is formed of metal or poly-Si over both side walls and the bottom of the trench 605 through a dielectric layer 608. The part of the cell plate 607 facing the second diffused region 606 constitutes the other electrode of the capacitor 2. The remaining portion of the cell plate 607 constitutes the other electrode of the capacitors of the adjoining memory cells. A diffused region 609b is formed under the isolating region 609 for isolating adjoining memory cells from each other.

A DRAM constructed of memory cells in accordance with the sixth embodiment of the invention achieves results similar to those of the first embodiment. Further, the area of each memory cell of the sixth embodiment may be smaller than that of the first embodiment, because the side wall of the trench 605 is used as the capacitor region. As a result, the conductor for connecting the other electrodes of the capacitors to each other is not needed, as the cell plate 607 is connected at the bottom of the trench 605.

Figure 14:
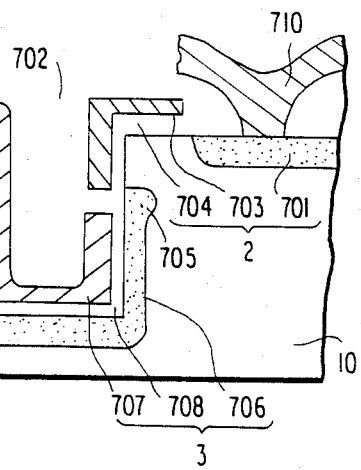
FIG. 14 is a cross-sectional view of a memory cell in accordance with a seventh embodiment of the invention.

FIG. 14 shows a cross-sectional view of a memory cell in accordance with a seventh embodiment of the invention. In FIG. 14, a source electrode 701 of the transistor 2 is formed as a diffused region at the center of a hexagonally-shaped memory cell region 1 in a major surface of a substrate 10, as in previously-described embodiments. The source electrode 701 is connected to a bit line 710. A hexagonally-shaped trench 702 is formed in the major surface around and apart from the source electrode 701. A gate electrode 703 of the transistor 2 is formed of a ring metal, such as Al, or poly-Si on the major surface of the substrate 10 around the source electrode 701 through the gate insulator 704 and has an elongated part along an inside wall of the trench 702 through the gate insulator 704.

A drain electrode 705 is formed as a second diffused region in the inside wall of the trench 702 around the the elongated part of the gate electrode 703. A third diffused region 706 constitutes one electrode of the capacitor 3 and is formed in the inside and outside walls and the bottom of the trench 702 and the surface of the substrate outside the trench 702. The end of the region 706 nearer the gate electrode 703 is formed continuously from the end of the second diffused region 705.

A cell plate 707 constitutes the other electrode of the capacitor 3 and is formed of metal or poly-Si on the inside and outside walls and the bottom of the trench 702 through a dielectric layer 708. The cell plate 707 is connected to the cell plate of the adjoining memory cell.

An isolating region 709 is formed in the major surface of the substrate 10 around the memory cell region 1 by local oxidation of Si. The inside of the isolating region 709 contacts the outside portion of the third diffused region 706. The center line of the isolating region 709 is a boundary between adjacent memory cells. The center line around each memory cell is hexagonal, as in the previously-described embodiments A diffused region 709a is formed under the isolating region 709 for isolating adjacent memory cells from each other.

A DRAM constructed of memory cells in accordance with the just-described seventh embodiment achieves results as in the first-described embodiment. Further, the area of each memory cell 1 may be smaller than that of the first embodiment, because the inside wall of the trench 702 is used in forming the gate electrode region of the transistor 2, and the inside and outside walls and the bottom of the trench 702 are used in forming the capacitor region.

Figure 15:
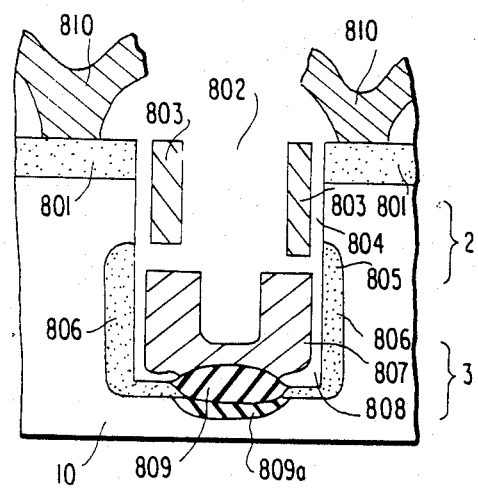
FIG. 15 is a cross-section view of a memory cell in accordance with an eighth embodiment of the invention and FIG. 16 is a horizontal pattern in a memory cell in accordance with a ninth embodiment of the invention

FIG. 15 shows a cross-sectional view of a memory cell in accordance with an eighth embodiment of the invention. In FIG. 15, a source electrode 801 of the transistor 2 is formed as a diffused region at the center of the memory cell in the major surface of a substrate 10. The planar shape of the source electrode 801 and the memory cell 1 are hexagonal. The source electrode 801 is connected to a bit line 810.

A trench 802 is formed in the major surface around the source electrode 801. One end of the source electrode 801 faces a hexagonally-shaped inside wall of the trench 802. A gate electrode 803 of the transistor 2 is formed of a ring metal, such as Al, or poly-Si along an upper portion of the inside wall of the trench 802 around the source electrode 801 through a gate insulator 804.

A drain electrode 805 is formed as a second diffused region in the inside wall of the trench 802 around the gate electrode 803. An isolating region 809 is formed in the bottom of the trench 802 around the memory cell 1 by local oxidation of Si. The cross-sectional area of the isolating region 809 around one of the memory cells is hexagonal. The center line of the isolating region 809 is a boundary between adjacent memory cells, as in the first embodiment.

A third diffused region 806 constitutes one electrode of the capacitor 3 and is formed in the inside wall of the trench 802 between the drain electrode 805 and the isolating region 809. One end of the third diffused region 806 is formed continuously from the drain electrode 805, and the other end thereof contacts the end of the isolating region 809.

A cell plate 807 is formed over lower portions of both side walls of the trench 802 and the bottom of the trench 802 through a dielectric layer 808. The part of the cell plate 807 facing the drain electrode 805 is the other electrode of the capacitor 2. The remaining part of the cell plate 807 is the other electrode of capacitors in adjoining memory cells. A diffused region 809a is formed under the isolating region 809 for isolating adjacent memory cells from each other.

A DRAM constructed of memory cells in accordance with the just-described eighth embodiment of the present invention achieves results similar to those of the above first embodiment. Further, the area of each memory cell may be smaller than that of the first embodiment, because the side walls of the trench 802 are used both as the gate electrode of the transistor 2 and as the capacitor region. As a result, the conductor for connecting the other electrodes of the capacitor to each other is not needed, as the cell plate 807 is connected at the bottom of the trench 802.

Figure 16:
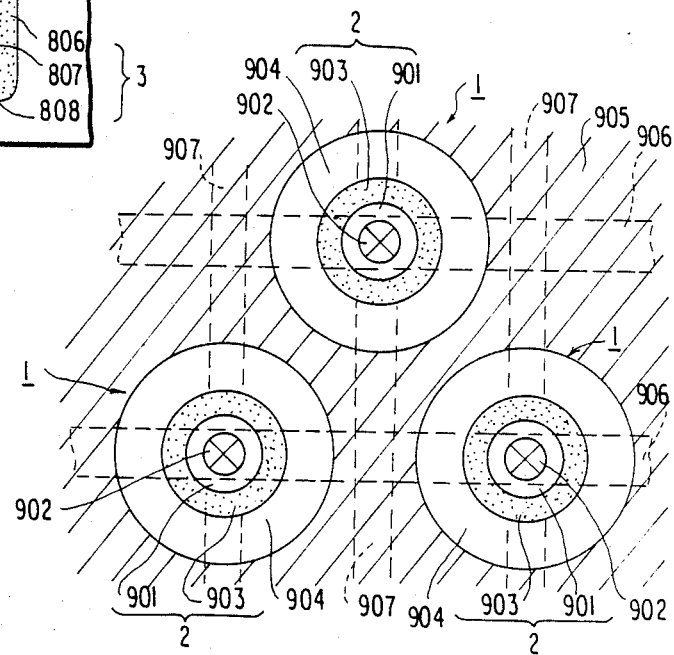

FIG. 16 shows a plan view of a memory cell in accordance with a ninth embodiment of the invention. In FIG. 16, a source electrode of the transistor 2 is formed as a diffused region at the center of the memory cell 1 in a major surface of the substrate. The source electrode 901 is connected to a bit line 906 through a contact hole 902. A gate electrode 903 of the transistor 2 is formed of a ring metal, such as Al, or poly-Si on the major surface of the substrate around the source electrode 901 through a gate insulator. A ring-shaped capacitor region 904 has a second diffused region formed in the major surface of the substrate around the gate electrode 903 and a cell plate formed on the second diffused region through a dielectric layer. An isolating region 905 is formed in the major surface of the substrate around the memory cell 1 by local oxidation of Si. A word line 907 is connected to the gate electrode 903 and formed continuously from the gate electrode 903.

A DRAM constructed of memory cells in accordance with the just-described ninth embodiment can prevent current leakage along the inside of the isolating region 905, as well as the change of the threshold voltage in the transistor 2 in accordance with spreading of the diffused impurities from the diffused region under the isolating region 905 to the channel region of the transistor 2.

As shown in all of the foregoing embodiments a DRAM constructed of memory cells in accordance with the present invention results in reducing current leakage along a boundary of isolation regions within each memory cell, and further enables stabilization of threshold voltage for each transistor for each memory cell. Further, according to a number of the just-described embodiments, the memory cell size may be decreased by combining functions of certain diffused regions.

Although the present invention has been disclosed in a number of embodiments above, it should be understood by the ordinarily skilled artisan that the invention is not limited to these embodiments, but rather may be implemented in any manner consistent with these embodiments as is known to be within the skill of the artisan. Further, the invention is not to be construed as limited to the described embodiments, but rather is defined within the appended claims which follow.

What is claimed is:

1. A memory cell in a semiconductor memory device comprising a plurality of memory cells, said memory cell comprising:

a substrate;

a transistor comprising first and second transistor electrodes and a ring-shaped gate electrode;

a capacitor comprising first and second capacitor electrodes;

an isolating region for isolating said memory cell from adjacent ones of said memory cells; and a gate insulator formed around said first transistor electrode and on a major surface of said substrate;

wherein:

said first transistor electrode is formed in said major surface of said substrate;

said ring-shaped gate electrode is formed around said first transistor electrode on said major surface of said substrate and is separated from said first electrode by said gate insulator, an inner circumference of said ring-shaped gate electrode overlapping an outer circumference of said first transistor electrode through said gate insulator;

said second transistor electrode is formed around said ring-shaped gate electrode in said major surface of said substrate, an inner circumference of said second transistor electrode overlapping an outer circumference of said ring-shaped gate electrode through said gate insulator;

said capacitor is formed between said isolating region and said ring-shaped gate electrode and is connected electrically to said transistor; and wherein said first and second transistor electrodes are shaped such that a current path between said first and second transistor electrodes is never parallel to a boundary between said isolating region and a remaining portion of said memory cell.

2. A memory cell according to claim 1, wherein said second transistor electrode also forms said first capacitor electrode.

3. A memory cell according to claim 1, wherein said first and second capacitor electrodes respectively comprise first and second cell plates on said major surface of said substrate through an insulator.

4. A memory cell according to claim 3, wherein a part of said first and second cell plates overlap said ring-shaped gate electrode.

5. A memory cell according to claim 1, wherein a trench is formed in said major surface of said substrate around a center of said memory cell, said trench having side walls and a bottom, said capacitor being formed in said trench.

6. A memory cell according to claim 5, wherein said trench is formed between said isolating region and said first transistor electrode.

7. A memory cell according to claim 5, wherein said second transistor electrode is formed in said trench, said first capacitor electrode being formed continuously from said second transistor electrode.

8. A memory cell according to claim 5, wherein said isolating region is formed in said bottom of said trench, such that adjacent ones of said memory cells have portions thereof formed in said trench.

9. A memory cell according to claim 5, wherein said capacitor comprises first and second cell plates, said first cell plate being formed along side walls and a bottom of said trench, said second cell plate being formed over said first cell plate, a dielectric material being interposed between said first and second cell plates.

10. A memory cell according to claim 9, wherein said second cell plate forms part of a capacitor for an adjacent one of said memory cells.

11. A memory cell according to claim 5, wherein at least a part of said ring-shaped gate electrode is formed in said trench, said second transistor electrode being formed along one of said side walls of said trench, said first capacitor electrode being formed continuously from said second transistor electrode.

12. A memory cell according to claim 11, wherein said isolating region is formed in said bottom of said trench, such that adjacent ones of said memory cells have portions thereof formed in said trench.

13. A memory cell according to claim 1, wherein said first transistor electrode is a source electrode.

14. A memory cell according to claim 1, wherein a side of said isolating region facing said memory cell has a hexagonal shape.

15. A memory cell according to claim 14, wherein said hexagonal shape includes first through sixth vertices, said first and fourth vertices being equidistant from a center of said hexagonal shape, said second and fifth vertices being equidistant from the center but farther from the center than said first and fourth vertices, and said third and sixth vertices being equidistant from the center.

16. A memory cell according to claim 1, wherein an outer surface of said capacitor region contacting said isolating region is circular in shape.

17. A memory cell according to claim 1, wherein one end of said first capacitor electrode extends over the ring-shaped gate electrode and the other end of said first capacitor electrode extends over said isolating region.

18. A memory cell according to claim 5, wherein at least a portion of said capacitor is formed along one of said side walls of said trench, one of said first and second capacitor electrodes being connected to said second transistor electrode 19. A memory cell according to claim 5, wherein said second transistor electrode also forms said first capacitor electrode, and is electrically connected to said first transistor electrode through a channel region formed directly under said gate electrode when said transistor is turned on, said second transistor electrode being formed along at least a portion of one of said side walls of said trench.

20. A memory cell according to claim 19, wherein said second capacitor electrode comprises a cell plate which is disposed over said first capacitor electrode through a dielectric layer.

21. A memory cell according to claim 11, wherein said ring-shaped gate electrode has a first portion formed on the major surface of said substrate through said gate insulator and a second portion, connected to said first portion, formed on one of said side walls of said trench through said gate insulator.

22. A memory cell according to claim 11, wherein said first transistor electrode is formed so as to have one end exposed along one of said side walls of said trench, and one end of said ring-shaped gate electrode is disposed directly over the exposed end of said first transistor electrode and another end of said ring-shaped gate electrode is disposed directly over one end of said second transistor electrode.

23. A memory cell according to claim 5, wherein said first and second capacitor electrodes respectively comprise first and second cell plates, said first cell plate being formed over side walls and a bottom of said trench through a first dielectric layer, said second cell plate being formed over said first cell plate through a second dielectric layer.

24. A random access memory device comprising:
a substrate;
a plurality of rows and columns;
a plurality of bit lines disposed in each of said columns over said substrate;
a plurality of memory cells disposed in each of said columns and each of said rows, each of said memory cells comprising a transistor and a capacitor, said transistor comprising first and second transistor electrodes and a ring-shaped gate electrode, said first transistor electrode comprising a first diffused region disposed at a center of said each of said memory cells in said substrate and being connected to a corresponding bit line, said ring-shaped gate electrode being formed around said first transistor electrode on the major surface of said substrate through a gate insulator and being connected to a corresponding work line, said gate insulator being formed in said major surface of said substrate, an inner circumference of said ring-shaped gate electrode overlapping an outer circumference of said first transistor electrode through said gate insulator, said second transistor electrode being formed around said ring-shaped gate electrode, an inner circumference of said second transistor electrode overlapping an outer circumference of said ring-shaped gate electrode through said gate insulator, said capacitor comprising first and second capacitor electrodes and also being formed around said ring-shaped gate electrode; and wherein:
said first transistor electrode is formed in said major surface of said substrate;
said ring-shaped gate electrode is formed around said first transistor electrode on said major surface of said substrate and is separated from said first electrode by said gate insulator, an inner circumference of said ring-shaped gate electrode overlapping an outer circumference of said first transistor electrode through said gate insulator;
said second transistor electrode is formed around said ring-shaped gate electrode in said major surface of said substrate, an inner circumference of said second transistor electrode overlapping an outer circumference of said ring-shaped gate electrode through said gate insulator;
said capacitor is formed between said isolating region and said ring-shaped gate electrode and is connected electrically to said transistor; and
wherein said first and second transistor electrodes are shaped such that a current path between said first and second transistor electrodes is never parallel to a boundary between said isolating region and a remaining portion of said memory cell.
an isolating region formed in the major surface of said substrate for isolating said memory cells from each other;
wherein said first and second transistor electrodes are shaped such that a current path between said first and second transistor electrodes is never parallel to a boundary between said isolating region and a remaining portion of said memory cell.

25. A random access memory device according to claim 24, further comprising at least one sense amplifier, wherein the bit line in each odd column and the bit line in each even column are connected to a corresponding sense amplifier.

26. A random access memory device according to claim 24, wherein the word line in each row is connected to one of the memory cells in each odd column and in each even column, and the word line in each even row is connected to another of the memory cells in each odd column and each even column.

27. A random access memory device according to claim 24, wherein each of said memory cells is hexagonal in shape and a line passing through a center of said isolating region around each memory cell forms a hexagon.

28. A random access memory device according to claim 27, wherein a length of each of said memory cells along a corresponding column is greater than a length along a corresponding row.

29. A random access memory device according to claim 24, wherein at least one trench is formed in the major surface of said substrate, said at least one trench having side walls and a bottom and being formed around said first transistor electrode of each of said memory cells, and wherein said capacitor is formed at least along one of said side walls.

30. A random access memory device according to claim 29, wherein said isolating region is formed in said bottom of said at least one trench, and said first capacitor electrode comprises a second diffused region formed at least along one of said side walls of said at least one trench, said first capacitor electrode being electrically connected to said first transistor electrode through a channel region formed directly under said gate electrode when said transistor is turned on, said second capacitor electrode comprising a cell plate formed over said first capacitor electrode and having a U-shaped cross section, said second capacitor electrode being formed along said side walls and said bottom of said at least one trench through a dielectric layer.

31. A random access memory device according to claim 24, wherein said each of said memory cells further includes a trench formed in the major surface of said substrate around said first transistor electrode, at least a portion of said ring-shaped gate electrode being formed on an upper portion of a side wall of said trench near said first transistor electrode, and wherein said capacitor is formed around said ring-shaped gate electrode at least along said side wall of said trench near said first transistor electrode.

32. A random access memory device according to claim 31, wherein said first capacitor electrode comprises a second diffused region formed in at least one of said side walls of said trench near said first diffused region of each memory cell, said first capacitor electrode being electrically connected to said first diffused region through a channel region formed directly under said gate electrode when said transistor is turned on, said second capacitor electrode being formed over said first capacitor electrode through a dielectric layer.

33. A random access memory device according to claim 32, wherein an outer boundary of said memory cell is hexagonal, and a center line passing through said isolating region around each of said memory cells forms a hexagon.

34. A random access memory device according to claim 32, wherein said isolating region is formed in said bottom of said at least one trench, such that adjacent ones of said memory cells have portions thereof formed in said trench.

35. A random access memory device according to claim 24, wherein said first transistor electrode is a source electrode.

36. A memory cell in a semiconductor memory device comprising a plurality of memory cells, said memory cell comprising:
a substrate;
a transistor comprising first and second transistor electrodes and a ring-shaped gate electrode;
a capacitor comprising first and second capacitor electrodes;
an isolating region for isolating said memory cell from adjacent ones of said memory cells; and
a gate insulator formed around said first transistor electrode and on a major surface of said substrate;
wherein:
said first transistor electrode is formed in said major surface of said substrate;
said ring-shaped gate electrode is formed around said first transistor electrode on said major surface of said substrate and is separated from said first electrode by said gate insulator, an inner circumference of said ring-shaped gate electrode overlapping an outer circumference of said first transistor electrode through said gate insulator;
said second transistor electrode is formed around said ring-shaped gate electrode in said major surface of said substrate, an inner circumference of said second transistor electrode overlapping an outer circumference of said ring-shaped gate electrode through said gate insulator, and an outer circumference of said second transistor electrode touching an inner circumference of said isolating region;

said first capacitor electrode is formed between said isolating region and said ring-shaped gate electrode and is connected electrically to said second transistor electrode, an inner end of said first capacitor electrode overlapping an outer end of said ring-shaped gate electrode through an insulator, an outer end of said first capacitor electrode overlapping an inner end of said isolated region;

said second capacitor electrode is formed on said first capacitor electrode through another insulator; and wherein said first and second transistor electrodes are shaped such that a current path between said first and second transistor electrodes is never parallel to a boundary between said isolating region and a remaining portion of said memory cell.

37. A memory cell in a semiconductor memory device comprising a plurality of memory cells formed in a substrate, each said memory cell having a trench formed in a major surface of said substrate around a center of said memory cell, said trench having side walls and a bottom, said memory cell further comprising:

a transistor comprising first and second transistor electrodes and a ring-shaped gate electrode;

a capacitor comprising first and second capacitor electrodes;

an isolating region for isolating said memory cell from adjacent ones of said memory cells; and a gate insulator formed around said first transistor electrode and on an upper part of one of said side walls of said trench;

wherein:

said first transistor electrode is formed in said major surface of said substrate, the outer end of said first transistor electrode being exposed at one of said side walls of said trench;

said ring-shaped gate electrode is formed around said first transistor electrode and along one of said side walls of said trench, and is separated from said first electrode by said gate insulator;

said second transistor electrode is formed around said ring-shaped gate electrode and along one of said side walls of said trench;

said first capacitor electrode is formed between said isolating region and said second transistor electrode and along at least one of said side walls of said trench, and is connected electrically to said second transistor electrode; and said second capacitor electrode is formed over said first capacitor electrode through an insulator; and wherein said first and second transistor electrodes are shaped such that a current path between said first and second transistor electrodes is never parallel to a boundary between said isolating region and a remaining portion of said memory cell.

* * * * *